(12) United States Patent
Iwanami et al.

(10) Patent No.: US 7,385,393 B2
(45) Date of Patent: Jun. 10, 2008

(54) MAGNETIC FIELD MEASURING APPARATUS CAPABLE OF MEASURING AT HIGH SPATIAL RESOLUTION

(75) Inventors: Mizuki Iwanami, Tokyo (JP); Shigeki Hoshino, Tokyo (JP); Masahiro Tsuchiya, Tokyo (JP); Masato Kishi, Tokyo (JP)

(73) Assignee: NEC Corporation, Tokyo (JP)

( * ) Notice: Subject to any disclaimer, the term of this patent is extended or adjusted under 35 U.S.C. 154(b) by 210 days.

(21) Appl. No.: 10/927,376

(22) Filed: Aug. 27, 2004

(65) Prior Publication Data

US 2005/0190358 A1 Sep. 1, 2005

(30) Foreign Application Priority Data

Feb. 27, 2004 (JP) ............... 2004-052859

(51) Int. Cl.
*G01R 33/032* (2006.01)
*G02F 1/09* (2006.01)
(52) U.S. Cl. .................... 324/244.1; 359/280
(58) Field of Classification Search ............ 324/244.1; 359/280–284
See application file for complete search history.

(56) References Cited

U.S. PATENT DOCUMENTS

| 5,214,377 | A | * | 5/1993 | Maurice et al. ............. 324/204 |
| 5,280,173 | A | * | 1/1994 | Morse et al. ........... 250/227.23 |
| 5,742,157 | A | * | 4/1998 | Ishizuka et al. ............... 324/96 |
| 6,195,479 | B1 | * | 2/2001 | Pan .............................. 385/18 |

FOREIGN PATENT DOCUMENTS

| JP | S60-129676 A | 7/1985 |
| JP | H08-94692 A | 4/1996 |
| JP | H08-262374 A | 10/1996 |

OTHER PUBLICATIONS

Shinchi Wakana et al. Performance Evaluation of Fiber-Edge Magnetooptic Probe, Journal of Lightwave Technology, vol. 21 No. 12 (2003), all pages.*
E. Yamazaki et al., Three-Dimensional Magneto-Optic Near-Field Mapping Over 10-50 um Scale Line and Space Circuit Patterns, IEEE, 2001.*
M. Tsuchiya, et al., "Microscopic Distribution Measurements of Microwave Frequency Magnetic Fields by Fiber -Edge Magneto-Optic (FEMO) Probing", Journal of the Magnetics Society of Japan, vol. 26, No. 3, p. 128-134, 2002.
Shinichi Wakana, et al., "Study of the Crystal Size Effect on Spatial Resolution in Three-Dimensional Measurement of Fine Electromagnetic Field Distribution by Optical Probing", The Japan Society of Applied Physics, vol. 42, No. 10, p. 6637-6640, Oct. 2003.
Mizuki Iwanami, et al., Magnetic Near-Field Distribution Measurements Over Fine Meander Circuit Patterns by Fiber-Optic Magneto-Optic Probe, Proc. 2003 IEEE Symposium on Electromagnetic Compatibility, p. 347-352, Aug. 18-22, 2003.

* cited by examiner

*Primary Examiner*—Reena Aurora
*Assistant Examiner*—Kenneth J Whittington
(74) *Attorney, Agent, or Firm*—Sughrue Mion, PLLC

(57) ABSTRACT

A condenser lens is incorporated into the end portion of a magnetic field measuring apparatus including a magneto-optical crystal. Alternatively, the end portion of the magnetic field measuring device includes an optical fiber having a core diameter smaller than that of a normal single-mode optical fiber.

4 Claims, 4 Drawing Sheets

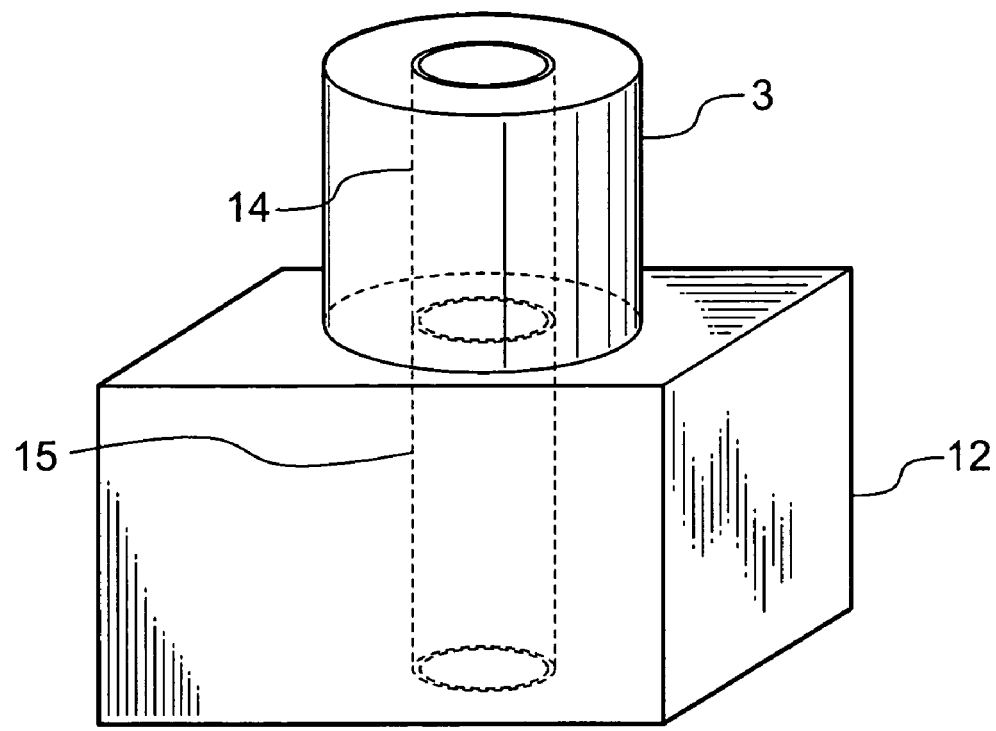
FIG. 2 PRIOR ART
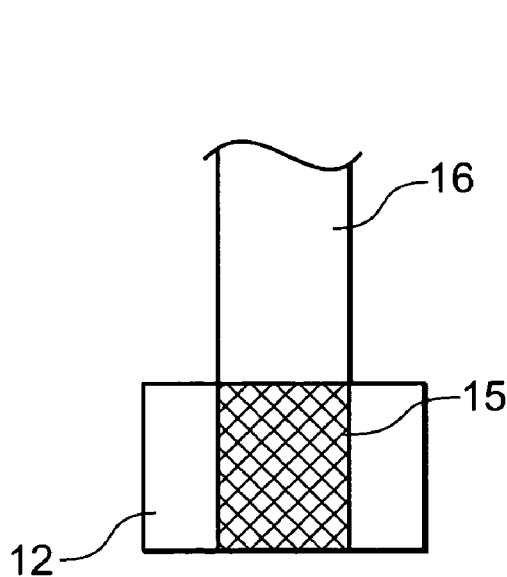
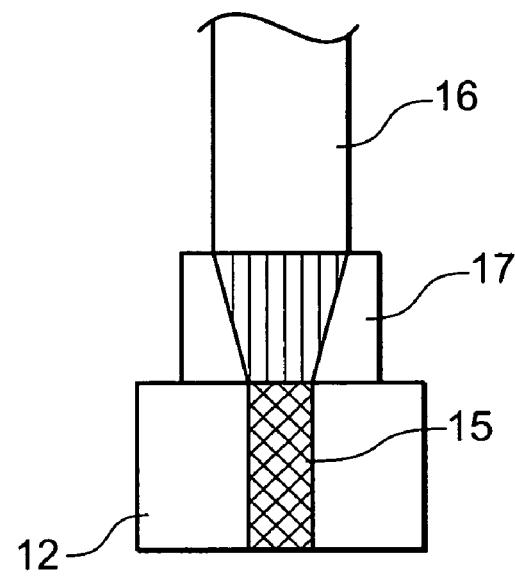
FIG. 3A    FIG. 3B

MAGNETIC FIELD MEASURING APPARATUS CAPABLE OF MEASURING AT HIGH SPATIAL RESOLUTION

This application claims priority to prior application JP 2004-52859, the disclosure of which is incorporated herein by reference.

BACKGROUND OF THE INVENTION

1. Field of the Invention

The present invention relates to an apparatus for measuring a magnetic field closely above an integrated circuit or a large-scale-integration device (hereinafter referred to as IC/LSI), an IC/LSI package, and a printed circuit board.

2. Description of the Related Art

FIG. 1A is a schematic view showing an example of a conventional magnetic field measuring apparatus using optical technology. This magnetic field measuring apparatus includes a magneto-optical crystal (hereinafter referred to as MO crystal) as a magnetic field detecting element, optical fibers, and optical devices. Such a magnetic field measuring apparatus is disclosed in, for example, Tsuchiya, Yamazaki, Wakana, and Kishi, "Hikari faiba tan jiki kogaku (FEMO) purobu ni yoru bisho ryoiki maikuro ha tai jiki bumpu sokutei (Microscopic Distribution Measurements of Microwave Frequency Magnetic Fields by Fiber-Edge Magneto-Optic (FEMO) Probing)", Nihon Oyo Jiki Gakkaishi (Journal of the Magnetics Society of Japan), Vol. 26, No. 3, pp. 128-134 (2002) (hereinafter referred to as Document 1).

FIG. 1B is an enlarged view of the end portion of this magnetic field measuring apparatus. The end portion includes an optical fiber 3, an MO crystal 12 attached to the end of the optical fiber 3, and a dielectric film 13 formed onto the bottom of the MO crystal 12. The dielectric film 13 is for reflecting light incident on the MO crystal 12.

The principle of magnetic field detection in this magnetic field measuring apparatus will be described schematically below. The light emitted from a continuous-wave-generating semiconductor laser light source 2 is amplified by a fiber amplifier (light amplifier) 4-1. The amplified light passes through a polarization controller 5 and an optical circulator 6, and becomes perpendicularly incident on the MO crystal 12 from the end of the optical fiber 3. The incident light is reflected by the dielectric film 13 formed onto the bottom of the MO crystal 12, and returns to the optical fiber 3. Between incidence on the MO crystal 12 and return to the optical fiber 3, the light is polarization-modulated due to the Faraday effect according to the intensity of an external magnetic field.

The polarization-modulated light passes through the optical circulator 6 again, and is then intensity-modulated by an analyzer 7. The intensity-modulated light is amplified by another fiber amplifier 4-2 and then converted photoelectrically by a photodetector 8. The photocurrent from the photodetector 8 is input into a spectrum analyzer 10 through a coaxial cable 9. The spectrum analyzer 10 detects the peak of the photocurrent as a signal caused by the external magnetic field.

In the principle of this measuring system, since the intensity of the signal detected by the spectrum analyzer 10 varies according to the intensity of the external magnetic field, the magnetic field distribution can be measured by changing the position of the MO crystal 12 above a measured object 11.

When the external magnetic field is measured by using the conventional magnetic field measuring apparatus shown in FIGS. 1A and 1B, the spatial resolution is determined by the volume of the probe light propagating in the MO crystal 12. The smaller the volume of the probe light, the higher the spatial resolution.

As shown in FIG. 2, the volume of a probe light 15 in the MO crystal 12 is approximately defined as the volume of the following cylinder. That is to say, the volume of the probe light in the crystal is equal to the volume of the cylinder having a diameter equal to the diameter of a core 14 of the optical fiber 3 and a height equal to the thickness of the MO crystal 12. This is disclosed in, for example, Wakana, Yamazaki, Iwanami, Hoshino, Kishi, and Tsuchiya, "Study of the Crystal Size Effect on Spatial Resolution in Three-Dimensional Measurement of Fine Electromagnetic Field Distribution by Optical Probing", Jpn. J. Appl. Phys. Vol. 42 (2003), pp. 6637-6640 (hereinafter referred to as Document 2).

The hitherto known magnetic field measuring apparatus has an end portion including an optical fiber with core diameter about 10 μm and an MO crystal with thickness 11 μm. It is reported that this magnetic field measuring apparatus has a spatial resolution capable of distinguishing the magnetic field generated from parallel conductors spaced at a distance of 10 μm and constituting a zigzag wiring. This is disclosed in, for example, Iwanami, Hoshino, Kishi, and Tsuchiya, "Magnetic Near-Field Distribution Measurements over Fine Meander Circuit Patterns by Fiber-Optic Magneto-Optic Probe", Proc. 2003 IEEE Symp. on Electromagnetic Compatibility, pp. 347-352, Aug. 18-22 (2003) (hereinafter referred to as Document 3). That is to say, the conventional magnetic field measuring apparatus using optical technology has achieved a 10-μm-level spatial resolution.

As described above, a magnetic field measuring apparatus having a 10-μm-level spatial resolution has been achieved. However, the 10-μm-level spatial resolution is inadequate for searching the source of electromagnetic interference (hereinafter referred to as EMI) in electronic devices or electronic circuits. An IC/LSI is a typical object searched for EMI sources. When a recent LSI chip or a compact LSI package having microscopic wiring is measured, a magnetic field measuring apparatus with higher spatial resolution is desired.

As described above, in the case of the magnetic field measuring apparatus including an MO crystal and optical devices, the spatial resolution is determined by the volume of the probe light propagating in the MO crystal. Therefore, in order to achieve a magnetic field measuring apparatus with a spatial resolution higher than that of the conventional magnetic field measuring apparatus including an MO crystal and optical devices, it is necessary to reduce the volume of the probe light in the MO crystal.

SUMMARY OF THE INVENTION

An object of the present invention is to provide a magnetic field measuring apparatus for measuring the high-frequency magnetic field generated from an IC/LSI, an IC/LSI package, and a printed circuit board as the objects searched for EMI sources at high spatial resolution.

The present invention attains this object by incorporating a condenser lens into the end portion of the magnetic field measuring apparatus. The object is attained by, for example, interposing the condenser lens between an optical fiber and an MO crystal in the end portion of the magnetic field measuring apparatus. Alternatively, the object is also attained by using a high-numerical-aperture fiber or a photonic crystal fiber having a core diameter smaller than that of a normal single-mode optical fiber for the optical fiber in the end portion of the magnetic field measuring apparatus.

BRIEF DESCRIPTION OF THE DRAWINGS

FIG. 2 is a schematic view of the probe light in the MO crystal in the end portion of the conventional magnetic field measuring apparatus shown in FIG. 1A;

FIGS. 3A and 3B are schematic views showing the end portion of the conventional magnetic field measuring apparatus and that of the magnetic field measuring apparatus according to the present invention, respectively, for comparison;

DESCRIPTION OF THE PREFERRED EMBODIMENTS

First, the principle of the present invention will be described with reference to FIGS. 3A and 3B. FIGS. 3A and 3B are schematic views showing the end portion of the magnetic field measuring apparatus including an MO crystal and optical devices. FIG. 3A shows the case where probe light 16 is directly incident on an MO crystal 12. On the other hand, FIG. 3B shows the case where the probe light 16 is incident on the MO crystal 12 via a condenser lens 17. By these figures, the volumes of the probe light 15 in the MO crystal 12 in both cases can be compared easily.

In the case where the probe light 16 is directly incident on the MO crystal 12, as explained with FIG. 2, the volume of the probe light 15 in the MO crystal 12 is approximately equal to the volume of the cylinder having a diameter equal to the diameter of the probe light 16 and a height equal to the thickness of the MO crystal 12.

On the other hand, in the case where the probe light 16 is incident on the MO crystal 12 via the condenser lens 17, the light is converged by the condenser lens 17. Consequently, as shown in FIG. 3B, the volume of the probe light 15 is obviously smaller than that in the case of FIG. 3A. As described above, incorporating a condenser lens 17 into the end portion of the magnetic field measuring apparatus reduces the volume of the probe light in the MO crystal 12 as compared with the conventional magnetic field measuring apparatus. Consequently, the magnetic field measuring apparatus according to the present invention can measure the magnetic field at a higher spatial resolution.

Alternatively, using an optical fiber having a core diameter smaller than that of a normal single-mode optical fiber for the optical fiber in the end portion of the magnetic field measuring apparatus reduces the diameter of the probe light incident on the MO crystal 12. Consequently, the magnetic field measuring apparatus according to the present invention can measure the magnetic field at a spatial resolution higher than that of the conventional magnetic field measuring apparatus.

Figure 4:
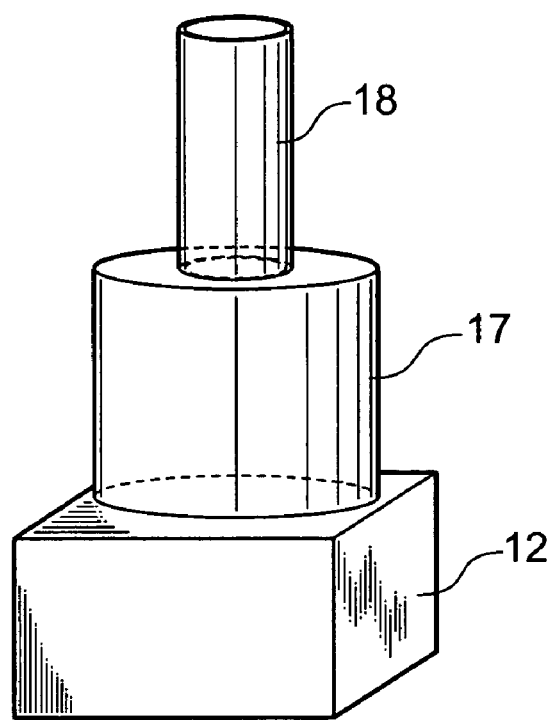
FIG. 4 is a schematic view showing the end portion of the magnetic field measuring apparatus according to a first embodiment of the present invention.

Next, embodiments of the present invention will be described. The magnetic field measuring apparatus according to a first embodiment of the present invention has the end portion shown in FIG. 4. In FIG. 4, the end portion is composed of a single-mode optical fiber 18, a condenser lens 17, and an MO crystal 12. The condenser lens 17 is disposed between the single-mode optical fiber 18 and the MO crystal 12. Specifically, the condenser lens 17 is disposed so as to be in contact with the surface of the MO crystal 12 on which the probe light is incident. Of course, a dielectric film (not shown) is formed onto the bottom of the MO crystal 12, as shown in FIG. 1B. This magnetic field measuring apparatus is composed of the end portion shown in FIG. 4 and the measuring system shown in FIG. 1. The components of the end portion are joined with, for example, epoxy resin adhesive.

Figure 1A:
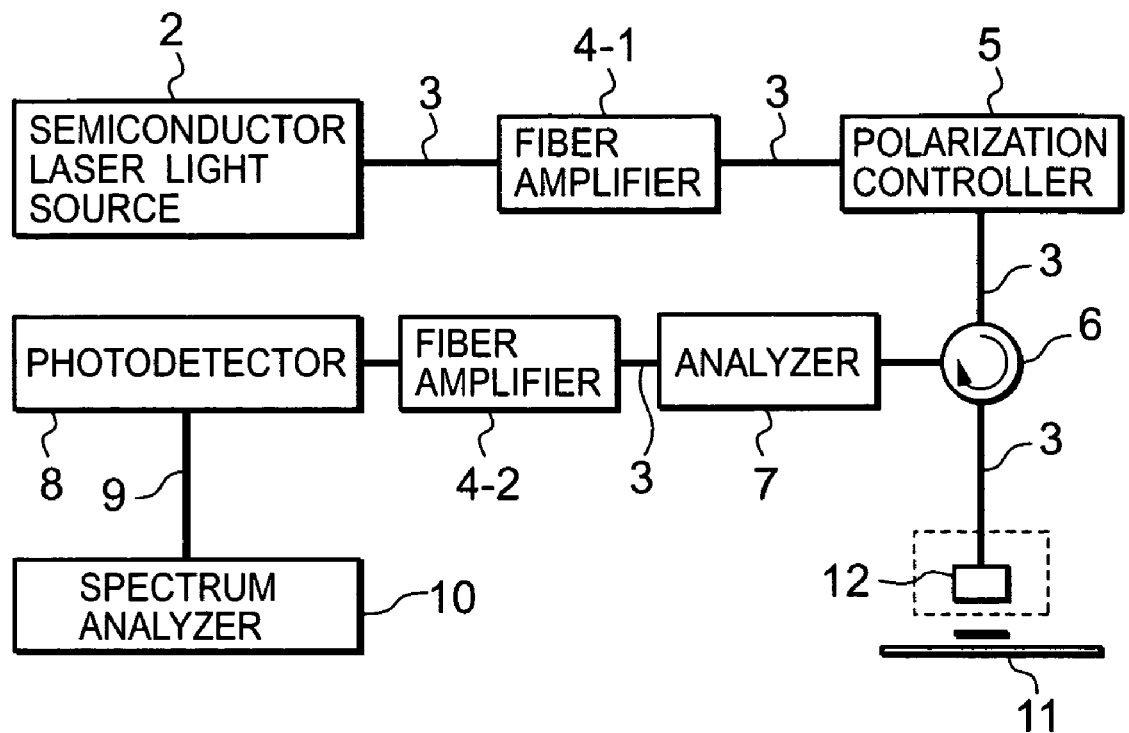
FIG. 1A is a schematic view showing an example of a conventional magnetic field measuring apparatus using optical technology.
Figure 1B:
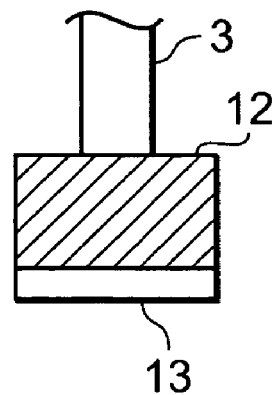
FIG. 1B is an enlarged view of the end portion of the magnetic field measuring apparatus shown in FIG. 1A.

As described in conjunction with FIG. 1A, the measuring system comprises a plurality of the optical devices which are connected with optical fibers. In FIG. 4, the optical fiber is also included in the end portion of the magnetic field measuring apparatus. The optical propagation means in the magnetic field measuring apparatus are not limited to the optical fibers. Laser light propagating in the space may be used as probe light. In this case, the condenser lens is also disposed on the surface of the MO crystal on which the probe light is incident. The magnetic field measuring apparatus of the present invention needs a laser light source. The laser light source may be a continuous wave light source and a pulsed light source.

In the magnetic field measuring apparatus composed of the end portion shown in FIG. 4 and the measuring system shown in FIG. 1, the principle of magnetic field detection or magnetic field distribution measurement is the same as that in the conventional magnetic field measuring apparatus described above.

As described above, the magnetic field measuring apparatus including an MO crystal and optical devices uses the polarization modulation due to the Faraday effect of light propagating in the MO crystal for detecting the magnetic field. Its spatial resolution is determined by the volume of the probe light in the MO crystal 12.

For example, incorporating the condenser lens 17 into the end portion of the magnetic field measuring apparatus as shown FIG. 4 reduces the volume of the probe light in the MO crystal 12 as compared with the conventional magnetic field measuring apparatus. Consequently, the magnetic field measuring apparatus according to the present invention can measure the magnetic field at a spatial resolution higher than that of the conventional magnetic field measuring apparatus.

Figure 5:
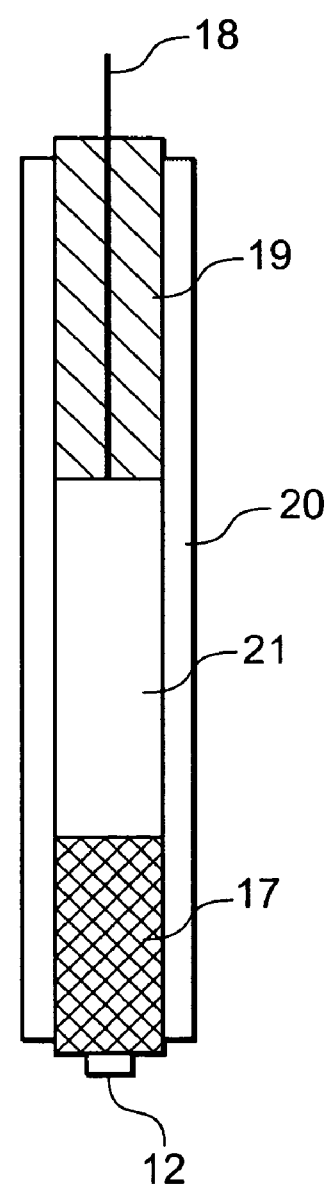
FIG. 5 is a schematic view showing an exemplary end portion of the magnetic field measuring apparatus according to the present invention.

FIG. 5 shows an exemplary end portion of the magnetic field measuring apparatus according to the present invention. The end portion of the magnetic field measuring apparatus is composed of a cylindrical glass tube 20, a single-mode optical fiber 18, a glass sleeve 19 for holding the fiber, a cylindrical condenser lens 17, and an MO crystal 12. A dielectric film (not shown) is formed onto the bottom of the MO crystal 12. The MO crystal 12 has the shape of a rectangular solid and is attached to the end of the condenser lens 17. The condenser lens 17 is held in one end of the glass tube 20. The MO crystal 12 is attached to the exit surface side of the condenser lens 17 projecting from the glass tube 20. The single mode optical fiber 18 is held in the other end of the glass tube 20 with the glass sleeve 19. The fiber 18 emits probe light toward the condenser lens 17. The cylindrical glass tube 20 has a length of 15.8 mm and an outside diameter of 2.8 mm. The cylindrical condenser lens 17 has a length of 4.4 mm and a diameter of 1.8 mm.

FIG. 5 is a schematic view in which the glass tube 20 is partly removed for showing the inside. In FIG. 5, a gap 21 is provided between the glass sleeve 19 and the condenser lens 17 in order to reduce the diameter of the probe light in the MO crystal 12. The MO crystal 12 has a plane size of 289 µm by 289 µm and a thickness of 16.5 µm.

The exemplary end portion shown in FIG. 5 is connected with the measuring system composed of a plurality of optical devices shown in FIG. 1A. For example, an optical connector is used for connecting the end portion and the measuring system.

When the magnetic field measuring apparatus composed of the end portion shown in FIG. 5 and the measuring system shown in FIG. 1 is operated, the volume of the probe light in the MO crystal is approximately as follows. That is to say, the volume of the probe light in the MO crystal is equal to the volume of the cylinder having a diameter of about 5 µm (the diameter of light) and a height of 16.5 µm (the thickness of the MO crystal). This volume is less than half the volume of the probe light in the MO crystal in the above-described conventional magnetic field measuring apparatus having a 10-µm-level spatial resolution. Therefore, the magnetic field measuring apparatus according to the present invention is capable of magnetic field measurement at a spatial resolution higher than that of the conventional magnetic field measuring apparatus.

Figure 6:
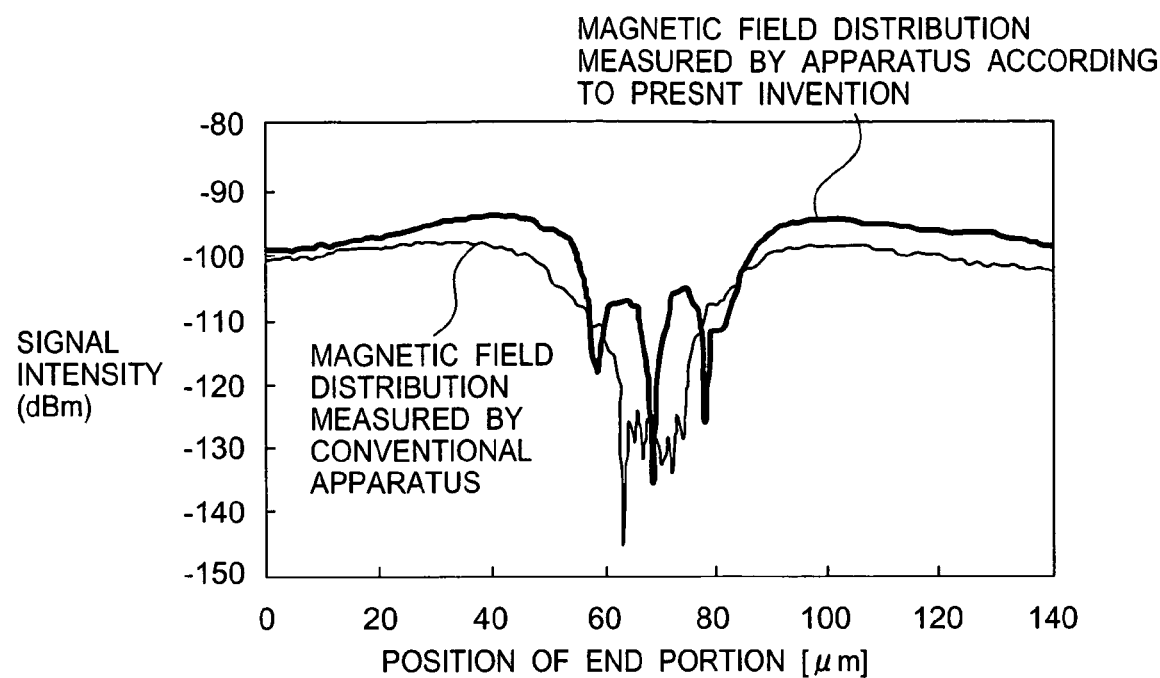
FIG. 6 shows the magnetic field distribution measured by the conventional magnetic field measuring apparatus and that measured by the magnetic field measuring apparatus according to the present invention for comparison.

FIG. 6 shows the magnetic field distribution measured by the conventional magnetic field measuring apparatus and that measured by the magnetic field measuring apparatus according to the present invention for comparison. The measured object is a zigzag wiring consisting of three parallel conductors spaced at a distance of 5 µm.

FIG. 6 shows the results obtained when the end portion of the magnetic field measuring apparatus scans in the direction crossing the wiring. The conventional magnetic field measuring apparatus can hardly distinguish the magnetic fields from the conductors. On the other hand, the magnetic field measuring apparatus according to the present invention can distinguish the magnetic fields from the conductors. These results show that the magnetic field measuring apparatus according to the present invention has a spatial resolution higher than that of the conventional magnetic field measuring apparatus.

Next, a second embodiment of the present invention will be described. The second embodiment is the magnetic field measuring apparatus shown in FIG. 1A, wherein the optical fiber in the end portion has a core diameter smaller than that of a single-mode optical fiber. Such optical fibers include a high-numerical-aperture fiber and a photonic crystal fiber. In either case, this embodiment needs no condenser lens in the first embodiment.

Figure 7:
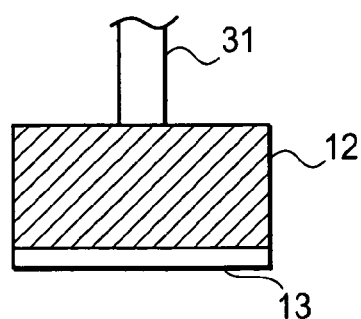
FIG. 7 is a schematic view showing the end portion of the magnetic field measuring apparatus according to a second embodiment of the present invention.

Referring to FIG. 7, assume that a magnetic field measuring apparatus composed of the end portion composed of a high-numerical-aperture fiber 31 with a core diameter of 5 µm and an MO crystal 12 with a thickness of 16.5 µm and the measuring system shown in FIG. 1A is used. In this case, the volume of the probe light in the MO crystal 12 is approximately equal to the volume of the cylinder having a diameter of about 5 µm and a height of 16.5 µm. The comparison between the magnetic field distribution measured by the conventional magnetic field measuring apparatus and that measured by the magnetic field measuring apparatus according to the present embodiment is also as shown in FIG. 6. Therefore, the magnetic field measuring apparatus according to the second embodiment of the present invention can also measure the magnetic field at a spatial resolution higher than that of the conventional magnetic field measuring apparatus.

The magnetic field measuring apparatus according to the present invention has the following advantageous effects.

First, it can search electronic circuits, particularly recent LSIs having microscopic wiring, for EMI sources in detail and precisely.

Second, since it can measure the current distribution with a high degree of accuracy by measuring the magnetic field at high spatial resolution, it can perform an operation check or a fault diagnosis/analysis of complicated electronic circuits.

What is claimed is:

1. A magnetic field measuring apparatus comprising:
   an end portion including a magneto-optical crystal as a magnetic field detecting element;
   a measuring system comprised of a plurality of optical devices; and
   an optical fiber connecting the magneto-optical crystal and the measuring system;
   wherein a condenser lens is disposed between the optical fiber and the magneto-optical crystal,
   the apparatus measures the magnetic field with a spatial resolution better than 10 µm,
   probe light is incident on the magneto-optical crystal from the optical fiber,
   the condenser lens is disposed to be in contact with a surface of the magneto-optical crystal on which the probe light is incident and to reduce a volume of the probe light in the magneto-optical crystal,
   and a dielectric film is formed on a bottom surface of the magneto-optical crystal, and reflects the probe light incident on the dielectric film.

2. A magnetic field measuring apparatus comprising:
   an end portion including a magneto-optical crystal as a magnetic field detecting element;
   a measuring system comprised of a plurality of optical devices; and
   an optical fiber connecting the magneto-optical crystal and the measuring system;
   wherein a condenser lens is disposed between the optical fiber and the magneto-optical crystal,
   probe light is incident on the magneto-optical crystal from the optical fiber,
   the condenser lens is disposed to be in contact with a surface of the magneto-optical crystal on which the probe light is incident and to reduce a volume of the probe light in the magneto-optical crystal,
   a dielectric film is formed on a bottom surface of the magneto-optical crystal, and reflects the probe light incident on the dielectric film, and
   the optical fiber is a single-mode optical fiber.

3. A magnetic field measuring apparatus comprising:
   an end portion including a magneto-optical crystal as a magnetic field detecting element;
   a measuring system comprised of a plurality of optical devices; and
   an optical fiber connecting the magneto-optical crystal and the measuring system;
   wherein a condenser lens is disposed between the optical fiber and the magneto-optical crystal, probe light is incident on the condenser lens from the optical fiber, the condenser lens is disposed to be in contact with a surface of the magneto-optical crystal on which the probe light is incident and to reduce the volume of the probe light in the magneto-optical crystal, a dielectric film is formed on a bottom surface of the magneto-optical crystal, and reflects the probe light incident on the dielectric film, the end portion includes a glass tube, the condenser lens is held in one end of the glass tube, the optical fiber is a single-mode optical fiber and is held in the other end of the glass tube with a glass sleeve so as to emit the probe light toward the condenser lens;

and a gap is provided between the emitting end of the single-mode optical fiber and the condenser lens.

4. The magnetic field measuring apparatus according to claim 3, wherein the gap is in contact with a emitting end of the single-mode optical fiber.

* * * * *